(12) United States Patent  
Shiraki

(10) Patent No.: US 6,969,808 B2
(45) Date of Patent: Nov. 29, 2005

(54) MULTI-LAYER PRINTED BOARD

(75) Inventor: Yasuhiro Shiraki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 168 days.

(21) Appl. No.: 10/663,723

(22) Filed: Sep. 17, 2003

(65) Prior Publication Data
US 2005/0173150 A1  Aug. 11, 2005

(30) Foreign Application Priority Data
Feb. 7, 2003  (JP) .............................. 2003-030488

(51) Int. Cl.$^7$ .............................................. H05K 1/03
(52) U.S. Cl. ........................ 174/255; 174/262; 361/794
(58) Field of Search .................................. 174/255, 261, 174/262, 263, 264, 265, 266, 260; 361/760, 361/792, 793, 794, 795, 767, 777

(56) References Cited

U.S. PATENT DOCUMENTS 6,201,305 B1 * 3/2001 Darveaux et al. ........... 257/779
6,700,789 B2 * 3/2004 Shirasaki ..................... 361/748
6,794,961 B2 * 9/2004 Nagaishi et al. ............ 333/247
6,828,513 B2 * 12/2004 Kistner ....................... 174/261
2002/0036099 A1  3/2002 Hachiya

FOREIGN PATENT DOCUMENTS

| JP | 11-54869 | 2/1999 |
| JP | 2000-216510 | 8/2000 |
| JP | 2002-111230 | 4/2002 |

* cited by examiner

Primary Examiner—Kamand Cuneo
Assistant Examiner—Ishwar (I. B.) Patel
(74) Attorney, Agent, or Firm—Leydig, Voit & Mayer, Ltd.

(57) ABSTRACT

A multi-layer printed board including signal layers, each signal layer including a signal line, a through-hole, and a ground through-hole. The signal layer includes a land connecting the through-hole and the signal line. An external periphery of the land has a first portion farthest from a center of the land, and a second portion extending a shorter distance from the center of the land than the first portion. A portion of the external periphery of the land opposite to the ground through-hole closest to the center of the land is the second portion. Consequently, impedance matching can be improved even if a signal frequency is high.

9 Claims, 6 Drawing Sheets

MULTI-LAYER PRINTED BOARD

BACKGROUND OF THE INVENTION

1. Field of the Invention

The present invention relates to a multi-layer printed board with a plurality of layers. More particularly, the present invention relates to a multi-layer printed board including a plurality of signal layers each provided with a signal line, a through-hole electrically interconnecting the signal lines of the different signal layers, and a ground through-hole electrically interconnecting a plurality of ground layers or a plurality of power supply layers.

2. Description of the Background Art

In a printed board utilized for a communicating device, and the like, a high-density packaging and a high signaling rate are desired. In response, to achieve the high-density packaging, a printed board is generally formed of multiple layers, each with a signal line connected via a through-hole. To form the through-hole, a hole penetrating the printed board is firstly formed with a drill, or the like, such that the hole penetrates an enlarged electrode which is called land and is provided adjacent to the signal line. The hole is then plated inside or filled with a conductive material to interconnect the lands of the different signal layers to electrically interconnect signal interconnections. The land is provided for ensuring conduction in case of a positioning error in terms of positioning accuracy in forming a hole, and improving yield.

In a printed board with such a multi-layered configuration, however, as a signaling rate increases, impedance matching between a through-hole and a signal line deteriorates, disadvantageously resulting in degradation of a signal such as a distorted signal waveform.

The following are examples to improve impedance matching. In a multi-layer printed board described in Japanese Patent Laying-Open No. 11-54869, wherein a ground through-hole is provided adjacent to a through-hole connected to a micro strip line serving as a signal line, a diameter of the ground through-hole, and a distance from the through-hole connected to the micro strip line are adjusted to improve impedance matching. Also in a multi-layer printed board described in Japanese Patent Laying-Open No. 2002-111230, a ground/power supply layer placed immediately below a pad portion wider than a signal line is provided with a hollowed portion to reduce capacitive coupling to avoid impedance mismatching in the pad portion. In a multi-layer printed board described in Japanese Patent Laying-Open No. 2000-216510, the number of ground through-holes provided adjacent to a through-hole connected to a signal line is increased or decreased to improve impedance matching.

As a signaling rate increases, a signal frequency increases. In order to improve impedance matching to attain the ability to accommodate such a signal of high frequency, in the above mentioned multi-layer printed boards described in Japanese Patent Laying-Open Nos. 11-54869 and 2002-216510, a distance from the through-hole connected to the signal line must be decreased, and the number of the ground through-holes must be increased, respectively. However, a limit in manufacturing actually exists, which hinders an improvement exceeding a certain level.

As in the multi-layer printed board described in Japanese Patent Laying-Open No. 2002-111230, if a ground/power supply layer placed immediately below the pad portion is hollowed, impedance matching of a signal line placed immediately below a ground/power supply layer can deteriorate.

SUMMARY OF THE INVENTION

An object of the present invention is to provide a multi-layer printed board which can improve impedance matching even in case of a high signal frequency.

In accordance with a multi-layer printed board based on the present invention, the multi-layer printed board includes a plurality of signal layers each provided with a signal line, a through-hole electrically interconnecting the signal lines of the different signal layers, and a ground through-hole electrically interconnecting a plurality of ground layers or a plurality of power supply layers, wherein the signal layer is provided with a land connecting the through-hole and the signal line, wherein an external periphery of the land has a portion of a maximum radius where a distance from a center of the land is a maximum distance, and a portion having a shorter radius from the center of the land than the portion of the maximum radius, and wherein a portion which lies at the external periphery of the land and is opposite to the ground through-hole most adjacent to the center of the land, is formed of the portion of the shorter radius.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A multi-layer printed board in embodiments based on the present invention will be described in the following.

First Embodiment

A multi-layer printed board in an embodiment of the present invention will be described with reference to FIGS. 1 to 7.

Figure 2:
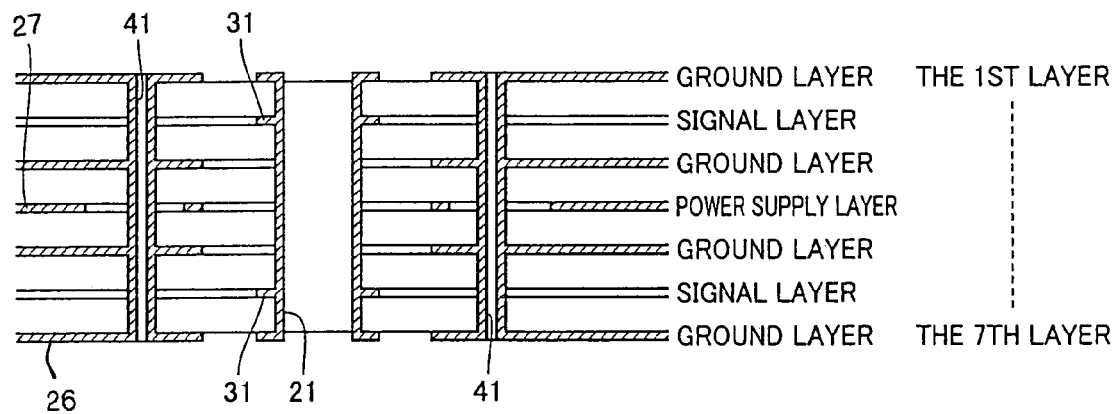
FIG. 2 is a longitudinal cross section of a structure taken along an arrow II—II of the multi-layer printed board in FIG. 1 in the first embodiment based on the present invention.

As shown in FIG. 2, the multi-layer printed board in the present embodiment includes seven layers, wherein each of first, third, fifth, and seventh layers is a ground layer, a fourth layer is a power supply layer, and each of second and sixth layer is a signal layer.

Figure 1:
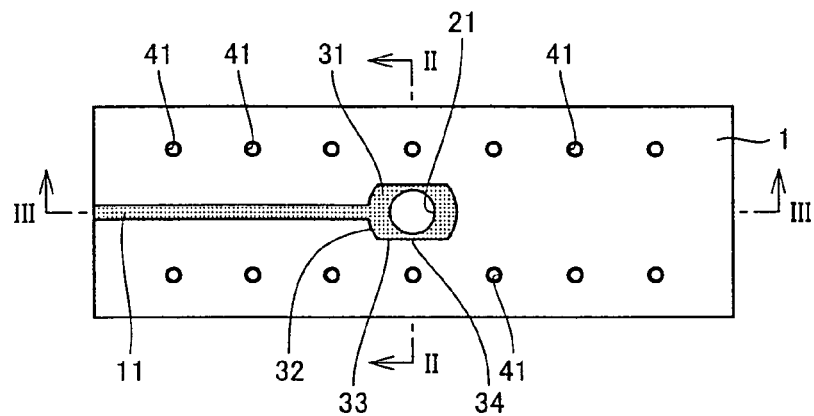
FIG. 1 is a plan view showing a structure around a through-hole in a signal layer of a multi-layer printed board in a first embodiment based on the present invention.
Figure 5:
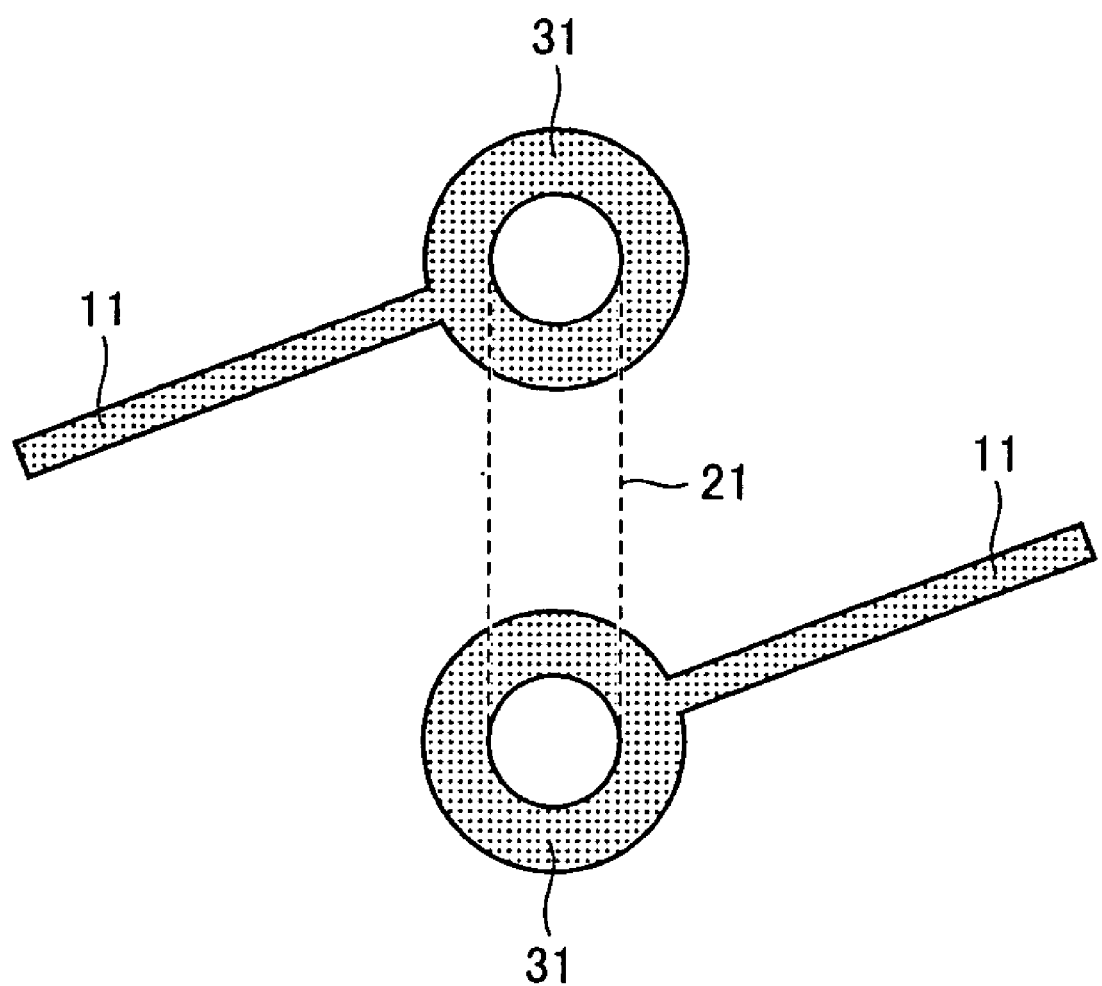
FIG. 5 is a perspective view showing a partial structure of the signal layers of the multi-layer printed board in the first embodiment based on the present invention.

As shown in FIG. 1, a signal layer 1 is provided with a signal line 11. In a place where signal line 11 and a through-hole 21 are electrically connected, a land 31 is formed. Its approximate center is penetrated by through-hole 21 as shown in FIG. 5.

To form through-hole 21, a hole penetrating the multi-layer printed board is firstly formed with a drill, or the like, such that the hole penetrates lands 31 of the different signal layers. The hole is then plated inside or filled with a conductive material. Consequently, as shown in FIG. 5, lands 31 of different signal layers, each of which is positioned in an overlying manner, are electrically interconnected. This enables formation of through-hole 21 electrically interconnecting signal lines 11. Land 31 is provided for ensuring conduction in case of a positioning error in terms of positioning accuracy in forming a hole. In the present specification, a through-hole includes not only a hole but a conductive material provided therein.

As shown in FIG. 2, each ground layer and the power supply layer are provided with a ground interconnection 26 and a power supply interconnection 27, respectively. Ground interconnection 26 and power supply interconnection 27 are provided in the form of a plane so that they spread generally across an entire surface of the ground layer and that of the power supply layer excluding a periphery of through-hole 21. Ground through-holes 41 are provided at appropriate places between the ground interconnections of the ground layers to electrically interconnect between ground interconnections 26. Ground through-holes 41 are arranged throughout the multi-layer printed board at predetermined intervals, only a part of which is shown in FIG. 1. A plurality of ground through-holes 41 are provided on both sides of signal line 11. Ground through-hole 41 is provided for returning to a signal source a signal generated by electrical resonance depending on the size of a multi-layer printed board as well as a signal reflected in through-hole 21.

Figure 3:
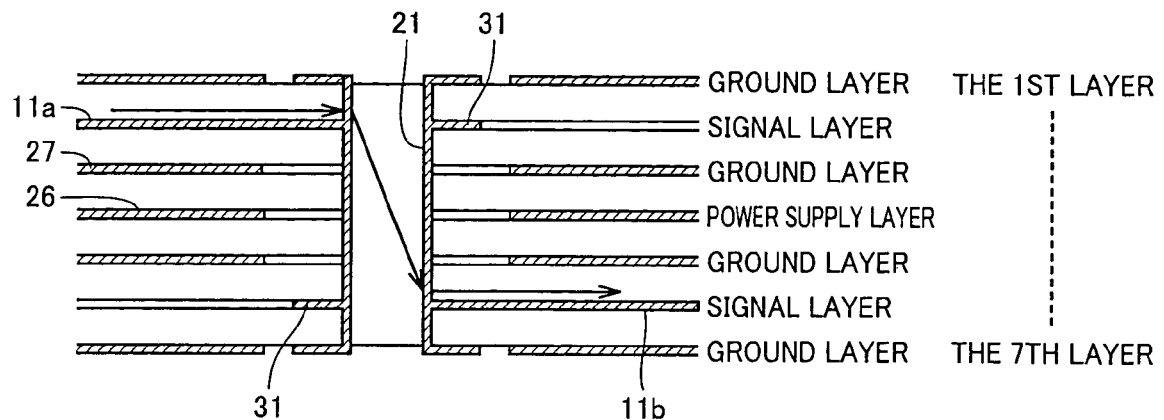
FIG. 3 is a longitudinal cross section of a structure taken along an arrow III—III of the multi-layer printed board in FIG. 1 in the first embodiment based on the present invention.
Figure 4:
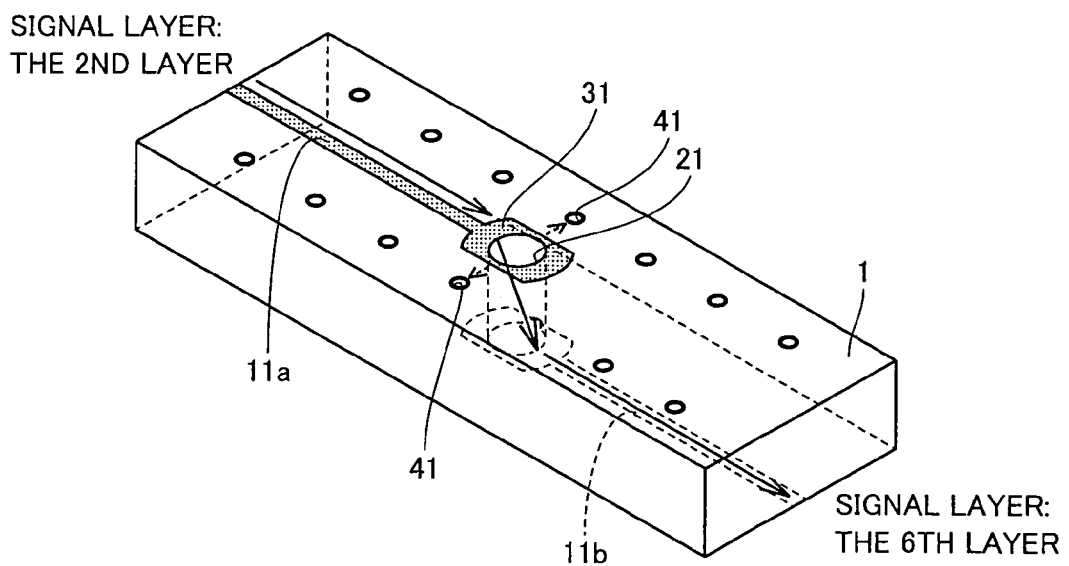
FIG. 4 is a perspective view showing a partial structure of a signal layer and an underlying layer of the multi-layer printed board in the first embodiment based on the present invention.

As shown in FIGS. 3 and 4, a signal line 11a of the second layer and a signal line 11b of the sixth layer are connected via through-hole 21. A signal transmitted through signal line 11a of the second layer is led through through-hole 21 to signal line 11b of the sixth layer. Simultaneously, a signal transmitted through signal line 11a is reflected in through-hole 21. The reflected signal is mainly transmitted from through-hole 21 to ground through-hole 41 by capacitive coupling. The signal is then transmitted via ground through-hole 41 to return to a signal source (not shown).

When a signal is transmitted to another layer via through-hole 21 as described above, electrical characteristics of through-hole 21 and land 31 connected thereto are important. Among others, decreased inductance of through-hole 21 itself, and decreased capacitance between land 31 of through-hole 21 and ground through-hole 41 are significantly important. Since inductance and capacitance are provided as described above, when a signal frequency is a particular resonance frequency, a transmitted signal takes a minimum value while a reflected signal takes a maximum value, which especially makes signal transmission difficult.

Figure 6A:
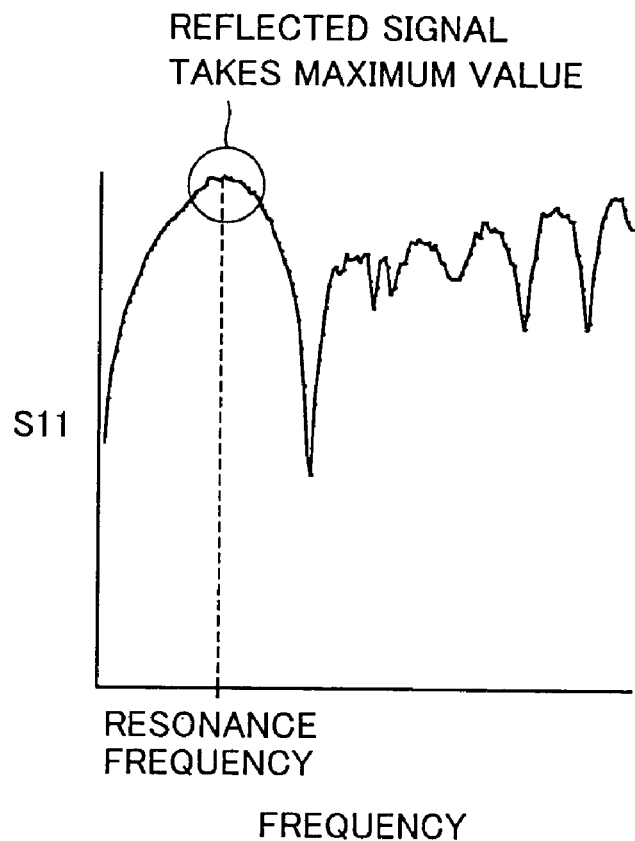
FIG. 6A is a graph showing a characteristic of a reflected signal in a multi-layer printed board.
Figure 6B:
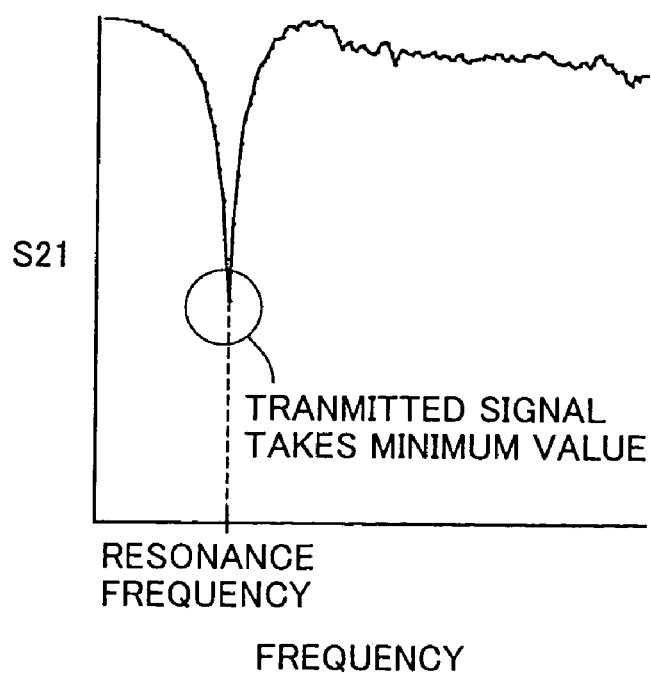
FIG. 6B is a graph showing a characteristic of a transmitted signal in a multi-layer printed board.

FIGS. 6A and 6B show such a condition. FIG. 6A is a graph showing a characteristic of a reflected signal, where a vertical axis represents a S11 characteristic (amplitude of a reflected signal/amplitude of an input signal) while a horizontal axis represents a frequency. FIG. 6B is a graph showing a characteristic of a transmitted signal, where a vertical axis represents a S21 characteristic (amplitude of a transmitted signal/amplitude of an input signal). Since a resonance frequency as shown in FIGS. 6A and 6B generally decreases as inductance and capacitance increase, to accommodate a signal of higher frequency, inductance and capacitance must be decreased to further increase its resonance frequency.

Figure 7:
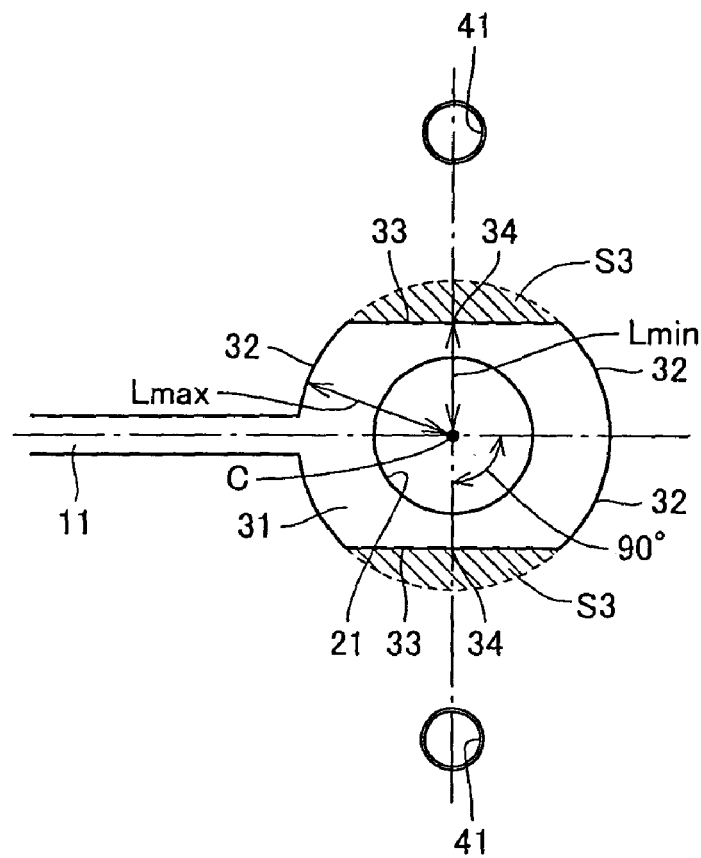
FIG. 7 is an enlarged view showing a structure around the through-hole in the signal layer of the multi-layer printed board in the first embodiment based on the present invention.

Therefore, in the present embodiment, a portion which lies at an external periphery of land 31 of through-hole 21 and is opposite to the most adjacent ground through-hole 41, is cut away as shown in FIG. 1. As shown in FIG. 7, the external periphery of land 31 of through-hole 21 is configured to have a portion of a maximum radius 32 where a distance from a center C of land 31 is a maximum distance (Lmax), and a portion having a shorter radius 33 from center C of land 31 than the portion of the maximum radius 32. A portion which lies at the external periphery of land 31 and is opposite to ground through-hole 41 most adjacent to center C of land 31, is formed of the portion of the shorter radius 33. Center C of the land in the present specification is defined as the center of land 31 on an extended center line of signal line 11 connected thereto.

Land 31 of through-hole 21 as conventional has a circular shape as shown in FIG. 5. In contrast, as shown in FIG. 7, land 31 of the present invention is configured such that a periphery of land 31 (shown hatched S3) that includes a portion opposite to ground through-hole 41 most adjacent to the center of land 31 is linearly cut away, with the portion of the shorter radius 33 receding inward from an otherwise existing arcuate line (indicated by a dotted line). A linear portion of the external periphery of land 31 in FIG. 7 is the portion of the shorter radius 33, and a portion shown hatched S3 outside thereof is the portion receding from a conventional land.

In the present embodiment, ground through-holes 41 are positioned in upward and downward directions of land 31 as seen in FIG. 7, i. e., in a direction perpendicular to that of signal line 11 with center C of land 31 defined as a reference point. Additionally, in the present embodiment, the portion of the shorter radius 33 of land 31 is configured to include a portion of a minimum radius 34 of land 31.

A signal transmitted through signal line 11 and reflected in through-hole 21, is transmitted to ground through-hole 41 most adjacent to through-hole 21 via land 31 electrically connected to through-hole 21, as shown with a dotted arrow in FIG. 4. The transmission is implemented by capacitive coupling depending on capacitance between a portion of the land 31 opposite to ground through-hole 41 and the ground through-hole. As in the present embodiment, the portion of land 31 opposite to ground through-hole 41 most adjacent to center C of land 31 is cut away to form the portion of the shorter radius 33. Consequently, land 31 of through-hole 21 and ground through-hole 41 can be spaced further apart to provide reduced capacitance. As a result, a resonance frequency can be increased to improve impedance matching to accommodate a signal of higher frequency.

Additionally, in the present embodiment, ground through-holes 41 are positioned in upward and downward directions of land 31 of through-hole 21 in FIG. 7, i. e., in a direction perpendicular to that of signal line 11 with center C of land 31 defined as a reference point. Therefore, a portion of land 31 to be cut away is 90° offset from a connection of signal line 11 and land 31. Thus, an original function of land 31 to ensure conduction even if through-hole 21 has a somewhat offset position, is less impaired. Additionally, in the present embodiment, the portion of the minimum radius 34 in the portion of the shorter radius 33 of land 31 of through-holes 21 corresponds to a portion opposite to ground through-hole 41. Therefore, impedance matching can be improved more effectively.

In the present embodiment, the portion of the shorter radius 33 of land 31 of through-hole 21 is configured to include the portion of the minimum radius 34. However, it may not be configured as such if a signal frequency is not so high. In the present embodiment, not only a portion of land 31 opposite to ground through-hole 41 most adjacent to center C of land 31 but a portion adjacent thereto is also formed of the portion of the shorter radius 33. However, only the portion opposite to ground through-hole 41 mentioned above (only the portion corresponding to the diameter of ground through-hole 41) may be formed of the portion of the shorter radius 33.

In the present embodiment, which has only a single power supply layer, a ground through-hole interconnecting power supply layers does not exist. However, if a plurality of power supply layers are provided, they can be interconnected with a ground through-hole. In such a case, a portion of land 31 opposite to the ground through-hole interconnecting the power supply layers is formed to recede.

In the present specification, a through-hole includes a via hole, and any other similar structures electrically interconnecting different layers.

Second Embodiment

For another embodiment, only the features different from those of the embodiment described above will be described.

Figure 8:
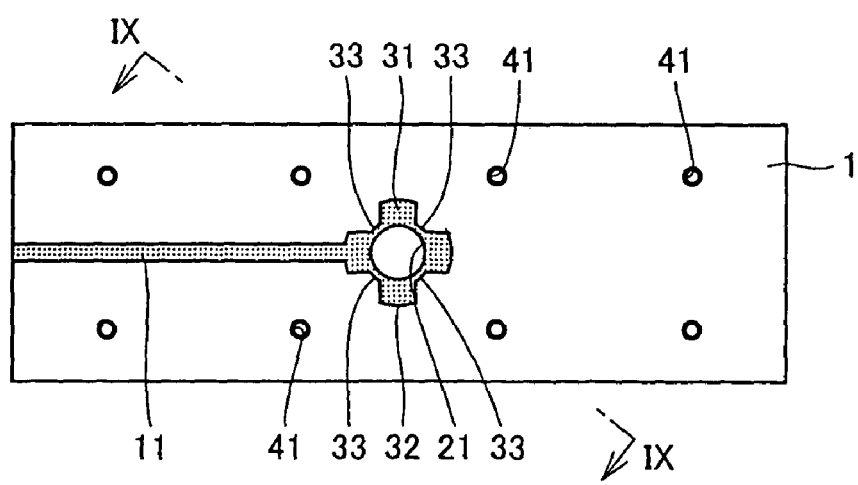
FIG. 8 is a plan view showing a partial structure of a signal layer of a multi-layer printed board in a second embodiment based on the present invention.
Figure 9:
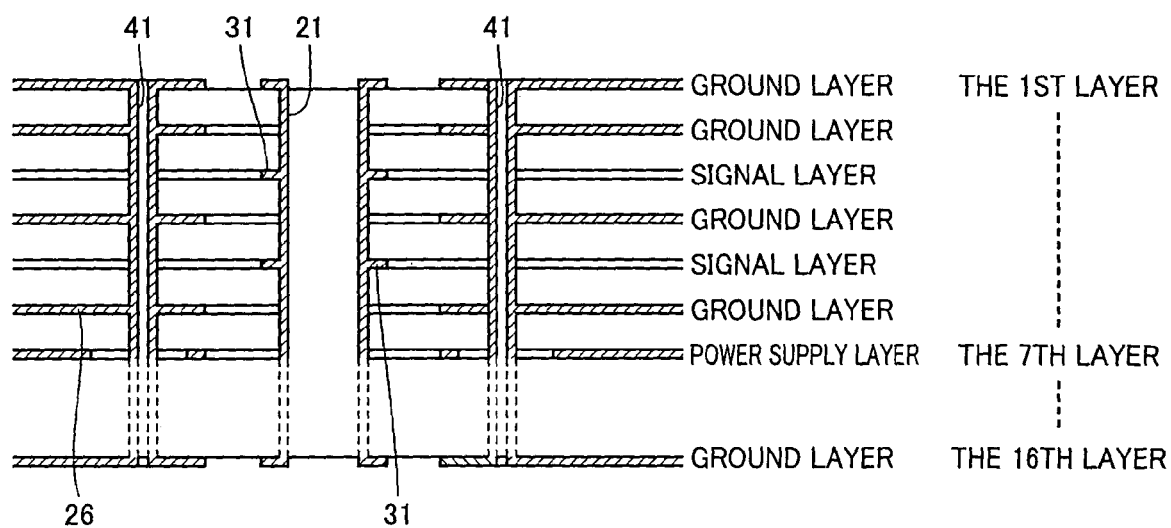
FIG. 9 is an explanatory view showing a structure of a cross section along an arrow IX—IX in FIG. 8 in the multi-layer printed board in the second embodiment based on the present invention.

As shown in FIG. 9, a multi-layer printed board of the present embodiment is formed of 16 layers, including a plurality of signal layers. As shown in FIG. 8, through-hole 21 is positioned exactly intermediate between ground through-holes 41. In other words, a center of through-hole 21 is positioned at an equal distance from four ground through-holes 41. In this case, since the center of through-hole 21 is placed at an equal distance from four ground through-holes 41, four opposite portions of land 31 are formed to recede to form four portions of shorter radius 33. In this case, again, decreased capacitance can increase a resonance frequency, at which a transmitted signal takes a minimum value while a reflected signal takes a maximum value, allowing much faster signal transmission. When the number of layers are increased as in the present embodiment, an effect of the present invention will be more significant.

The effect was verified in the multi-layer printed board of the present embodiments, using a finite difference time domain (FDTD) method as an electromagnetic field analysis. The test showed that a resonance frequency was 4.99 GHz for uncut circular land 31, whereas a resonance frequency was 5.94 GHz for land 31 of through-hole 21 partially cut away as in the embodiments of the present invention. Consequently, the present invention can accommodate a signal of higher frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multi-layer wiring board comprising:
   a plurality of electrically conducting layers laminated in a stack, with electrical insulation intervening between each closest pair of electrically conducting layers, said electrically conducting layers including
      a power supply layer,
      at least two signal layers, and
      a plurality of ground layers, alternating layers in said stack being ground layers;
   a plurality of electrically conducting ground through-holes having respective centers, penetrating through said stack, and electrically connecting said ground layers to each other; and
   an electrically conducting signal through-hole penetrating through said stack and electrically connecting said signal layers together, wherein
      at least one of said signal layers includes a land having a center and surrounding and electrically connected to said signal through-hole, and a signal line extending from and electrically connected to said land,
      said land includes a pair of first portions extending outwardly from opposite sides of said signal through-hole, said pair of first portions defining a first width of said land and lying generally transverse to a first diameter of said land, the first diameter passing through the center of said land,
      said land includes a pair of second portions extending outwardly from opposite sides of said signal through-hole, said pair of second portions defining a second width of said land and lying generally transverse to a second diameter of said land, and
      the first and second diameters are not co-linear, the second width is shorter than the first width, and the second diameter lies on a line connecting the center of said land and the center of said ground through-hole closest to said signal through-hole.

2. The multi-layer wiring board of claim 1 wherein said pair of first portions are arcuate, and
   said pair of second portions are linear.

3. The multi-layer wiring board of claim 2, wherein
   said ground through-hole closest to the center of said land is positioned along a line generally perpendicular to said signal line and passing through the center of said land, and
   one of said second portions intersects the line generally perpendicular to said signal line.

4. The multi-layer wiring board of claim 1, wherein said ground through-holes are positioned along lines lying on opposite sides of said signal line.

5. The multi-layer wiring board of claim 1, wherein a plurality of said ground through-holes are equidistant from the center of said land and lie along a plurality of lines passing through the center of said signal through-hole.

6. The multi-layer wiring board of claim 5, wherein the second width is oblique to said signal line.

7. The multi-layer wiring board of claim 5, wherein the second width is generally perpendicular to said signal line.

8. The multi-layer wiring board of claim 1, wherein said pair of first portions and said pair of second portions are arcuate.

9. The multi-layer wiring board of claim 8 including a plurality of pairs of said first portions and of said second portions.

* * * * *